United States Patent [19]

Kaufman et al.

[11] Patent Number: 4,881,034
[45] Date of Patent: Nov. 14, 1989

[54] SWITCHABLE MRI RF COIL ARRAY WITH INDIVIDUAL COILS HAVING DIFFERENT AND OVERLAPPING FIELDS OF VIEW

[75] Inventors: Leon Kaufman, San Francisco; Mitsuaki Arakawa, Hillsborough; Barry M. McCarten, Los Altos; John H. Fehn, El Sobrante; Stephen Krasnor, Oakland, all of Calif.

[73] Assignee: The Regents of the University of California, Berkeley, Calif.

[21] Appl. No.: 145,279

[22] Filed: Jan. 19, 1988

[51] Int. Cl.[4] ............................................ G01R 33/20
[52] U.S. Cl. ................................................ 324/318
[58] Field of Search ............................... 324/318, 322

[56] References Cited

U.S. PATENT DOCUMENTS

| 4,620,155 | 10/1986 | Edelstein | 324/318 |
| 4,636,730 | 1/1987 | Bottomley | 324/318 |
| 4,682,107 | 7/1987 | Bendall et al. | 324/307 |
| 4,703,274 | 10/1987 | Kaufman et al. | 324/318 |
| 4,728,896 | 3/1988 | Bendall et al. | 324/318 |

OTHER PUBLICATIONS

Book of Abstracts, vol. 2, "Society of Magnetic Resonance in Medicine"-Sixth Annual Meeting and Exhibition-Aug. 17-21, 1987, New York City, U.S.A. pp. 4,96,405,408,823,849.

Primary Examiner—Michael J. Tokar
Assistant Examiner—Lawrence G. Fess
Attorney, Agent, or Firm—Nixon & Vanderhye

[57] ABSTRACT

An array of plural magnetic resonance imaging (MRI) RF coils is provided having different and overlapping fields of view. Controllable switches are connected with each individual coil of the array and are capable of selectively conditioning any one of the coils for individual usage in an MRI procedure. Either mechanical or electrical (e.g., PIN diode) switching control may be utilized. Preferably, controllable electrical switches are located at points having approximately zero RF potential. Distributed capacitance is also preferably employed for reducing terminal inductance, preventing the establishment of spurious magnetic fields and facilitating the use of electrical switching diodes and/or varactor capacitance elements. Such distributed capacitances are also dimensioned so as to cause the terminal inductance of each coil to be within the tuning/matching range of a common tuning/matching RF circuit.

34 Claims, 2 Drawing Sheets

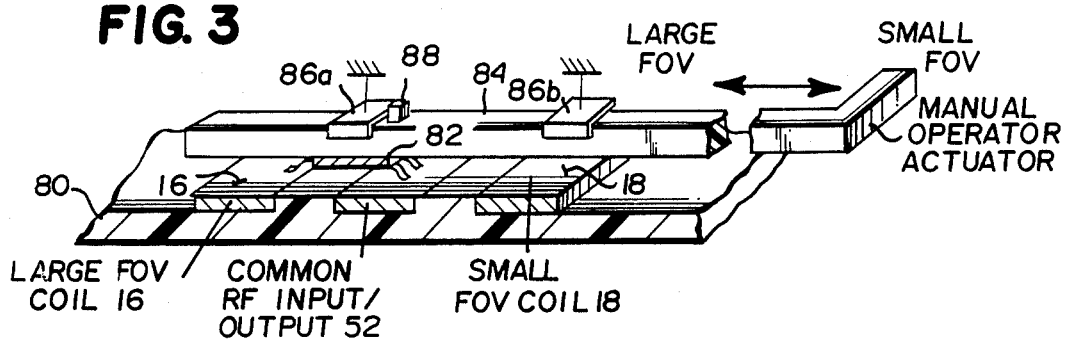
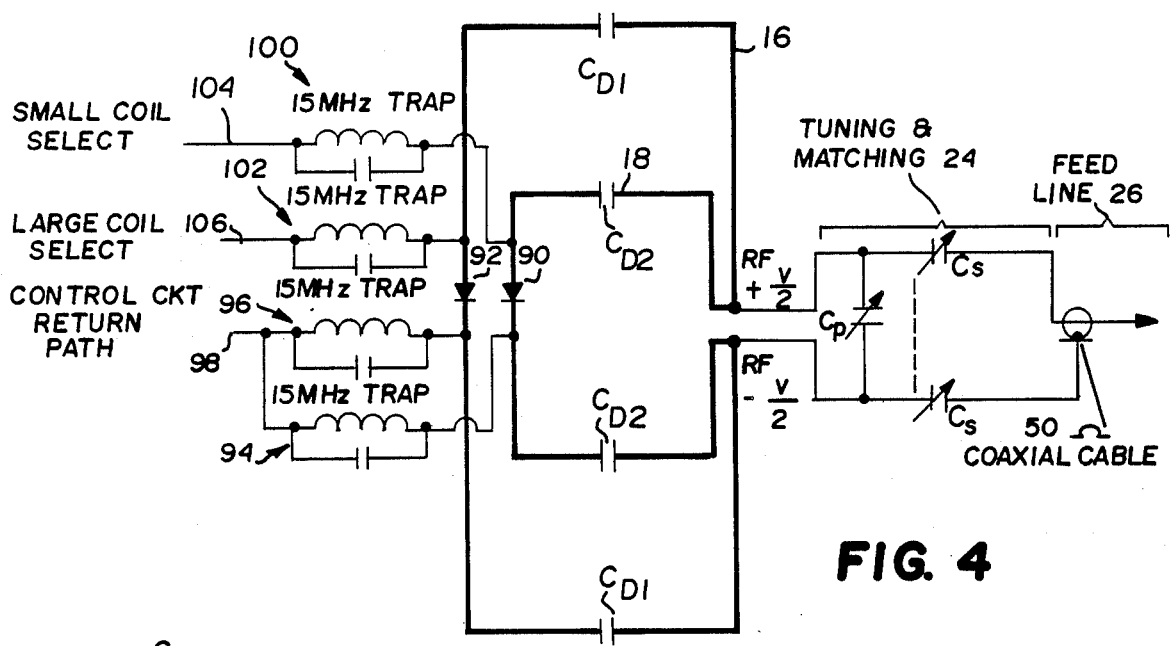
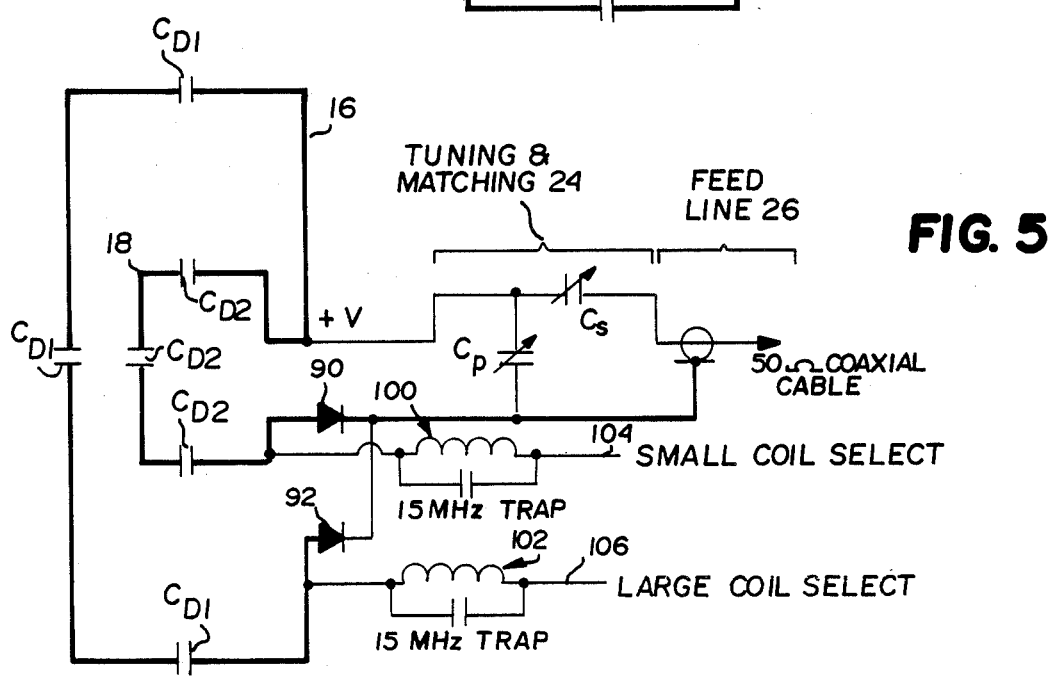

SWITCHABLE MRI RF COIL ARRAY WITH INDIVIDUAL COILS HAVING DIFFERENT AND OVERLAPPING FIELDS OF VIEW

This invention relates generally to magnetic resonance imaging (MRI) utilizing nuclear magnetic resonance (NMR) phenomena. It is particularly directed to method and apparatus associated with a selectively switchable array of MRI RF receiving coils having different and overlapping fields of view.

Magnetic resonance imaging (MRI) systems are now in extensive commercial usage. In general, a human body or other object to be imaged is situated within a static magnetic field onto which may be superimposed a predetermined sequence of magnetic gradients and RF excitation pulses which cause NMR responses to be elicited from certain nuclei. These characteristic NMR RF responses are coupled to a suitable RF coil, detected and processed by any one of a number of suitable MRI algorithms and thus used to create a digitized electronic image of selected two or three dimensional portions of the body or object under examination.

The design, physical realization and production of suitable RF coils for optimally coupling RF signals into and out of a human body (or other object) during MRI procedures turns out to be a very complex and difficult task. And it has also turned out to be one of the important subsystems of an overall MRI system with substantial effect on the imaging capability of that system.

For example, image quality can be improved by improving the achievable signal-to-noise ratio (SNR) of the system. It is well understood that such improvements in SNR may be achieved by limiting the volume to which a given RF coil is effectively coupled—e.g., its effective field of view (FOV). At the same time, if one has a very limited FOV, then it will be impossible to obtain a large scale screening FOV image with that same coil—and the positioning of a small FOV coil with respect to the patient then becomes critical because its FOV must clearly be spatially overlapping the particular body region of interest. Thus, if a single coil of limited FOV is utilized, it may be necessary to remove the patient and associated RF coil assembly from the patient bed and to reposition the coil with respect to the patient one or more times during an extended MRI procedure. This can be inconvenient for the patient—and it is also time consuming in an environment where time is very valuable due to the very high capital investment and/or costs of operating personnel and the like.

For example, when imaging the spine with MRI, it may be desirable to have an initial screening study over a long portion of the spine followed by a higher resolution study over a smaller portion of the spine. Assuming that electrical loading of the RF coil by the patient's body is the dominant source of image noise, noise levels obtained with any one coil will vary roughly in inverse proportion to the square root of the FOV of that coil. Thus, for a surface coil having a generally rectangular configuration, the SNR will decrease about 40% if the width is maintained constant and the longitudinal FOV is doubled. Furthermore, as spatial resolution is increased, the FOV of the longer coil may exceed that of the imaging sequence in the phase encoded axis. While there are techniques to reduce this particular problem, they increase the complexity of the imaging sequence and operation, can limit flexibility and may not everywhere be generally available.

We have concluded that to optimize the SNR of a given MRI study, the coil size should be chosen so as to have an FOV which matches the FOV of real imaging interest. In accordance with this conclusion, at least two RF receiving coils would be needed to perform a screening study followed by a more detailed higher resolution study.

In the past, different such coils have been utilized by physically replacing one coil with the other. Typically, this has required the patient to be removed from the patient bed for the coil swapping procedure. Clearly, this impairs operating efficiency—and the repeatability of body/center of FOV coil positioning is compromised if the patient moves while the coils are being physically swapped one for the other.

We have discovered a convenient alternative to such a physical coil swapping procedure. In particular, we have discovered a convenient and practical arrangement utilizing a switchable MRI RF coil array having a different and overlapping field of view for the individual coils in the array.

Prior to out conception and actual reduction to practice of this invention, we can recall no suggestion from others in the art of any type of switch selected MRI RF coils having different but overlapping fields of view which may be optimally switch selected so as to not necessitate physically repositioning or swapping RF coils during MRI studies. However, there recently have been some efforts by others along these general lines described during the Sixth Annual meeting and Exhibition of the Society of Magnetic Resonance and Medicine, Aug. 17–21, 1987 held in New York City. In addition to applicants' own abbreviated publication thereat, there were possibly related publications by others as noted below:

"Switched Array Coils: A new multi-purpose tool in MRI" by Hequardt et al, page 408.

"A New Revolution in Surface Coil Technology: The Array Surface Coil" by Boscamp, page 405.

"A Dual Cervical/Thoracic Spine Surface Coil: Clinical Throughput Considerations" by Totterman, et al. page 4.

"Practical Aspects of the Concentric Pair Surface Coil Design for Localizing Nuclear Magnetic Resonance Spectra from Human Organs" by Vaughan et at, page 849.

"Arrays of Mutually Coupled Local Coils for High Resolution MR Imaging" by Wright et al, page 96.

We have discovered a practical RF MRI coil array (e.g., having at least two individually usable and switch selectable coils which have differently dimensioned overlapping fields of view) and arrangements of controllable RF switches (e.g., either mechanically or electrically) actuated which may be connected with individual respectively associated coils and made capable for selective conditioning of any one of the coils for individualized use in an MRI procedure.

Preferably, each coil includes at least one distributed capacitance element as well as at least one controllable switch element serially disposed therealong. If the switch element is electrically operated, then each switch element has at least one control circuit electrically connected thereto so as to permit selective electrical actuation of its associated coil. Such control circuits typically include a parallel resonance RF trap circuit having an approximate parallel resonance maximum RF impedance at the intended MRI RF operating frequency of the coil (e.g., 15 MHz) while still having a relatively small DC impedance for the pulses of DC control currents used to control the switch (e.g., an array of parallel-connected PIN diodes).

The distributed capacitance elements are useful for simultaneously performing several important functions. For example, they may serve as the requisite DC blocking element so as to permit necessary DC bias voltages to be applied to PIN switching diodes and/or to varactor diode capacitance elements or the like (e.g., as used to tune/match the coil) while also preventing the flow of DC currents about the coil structure (which would produce spurious magnetic fields).

In addition, by distributing capacitance elements along the length of at least the larger coil structures, the effective terminal inductive reactance of such coils may be maintained at fairly low levels thus decreasing the magnitude of voltage swings and also making it possible to use a common RF tuning and/or impedance matching network for any one of the array coils that is selected for actual use at a given time.

Our preferred embodiment also locates the RF circuit switch elements at points having an approximately zero RF potential. By so doing, adverse effects upon the Q of the coil are minimized—and there is less likelihood of adverse RF coupling to the switch control circuits (which must necessarily be connected to the RF circuit in the case of PIN diodes). Although we have discovered a minimum switch control circuit configuration wherein a return circuit is shared by both the control circuit and an RF circuit, this arrangement requires an unbalanced RF coupling circuit. With somewhat more complexity in the control circuitry, a more desirable balanced RF coupling circuit may still be utilized.

In one exemplary embodiment, each of two surface coils are made of conductive strip material having interruptions in continuity at periodic intervals which are bridged by capacitance elements. One of the surface coils has an enclosed approximately rectangular area approximately twice that of the other coil—and they have approximately coincident centroids. Such a surface coil arrangement is particularly useful in MRI studies of the spine, as previously mentioned.

In an embodiment using a manually actuated switch for the selection of a given array coil, the exemplary embodiment includes an array of first, second and third fixed electrical conductive areas connected respectively to the first coil, to an RF input/output port (e.g., connected to the RF matching and tuning network) and to the second RF coil. A movable bridging contact having spring-loaded contact fingers is slidable into and out of bridging RF circuit contact between the common second contact area and either the first or third contact areas. It is mechanically coupled to an elongated operating arm which is slidably mounted for effecting the just mentioned slidable moveable of the spring-loaded contact member.

These as well as other objects and advantages of this invention will be more completely understood and appreciated by carefully reading the following detailed description of presently preferred exemplary embodiments, taken in conjunction with the accompanying drawings, of which:

FIG. 2a is a schematic depiction of the RF MRI coil array used in FIG. 1 while FIG. 2b is a schematic depiction of the reverse side of the coil structure shown in FIG. 2a;

FIG. 3 is a detailed view of the preferred mechanical switch embodiment for use with the coil of FIGS. 2a and 2b;

FIG. 4 is a schematic diagram of the preferred exemplary embodiment utilizing electrical switch elements and a balanced RF tuning/matching circuit; and FIG. 5 is a schematic diagram of an alternate embodiment of the RF coil array also using electrical switch elements and a somewhat simplified control circuit in conjunction with an unbalanced RF tuning/matching circuit.

Figure 1:
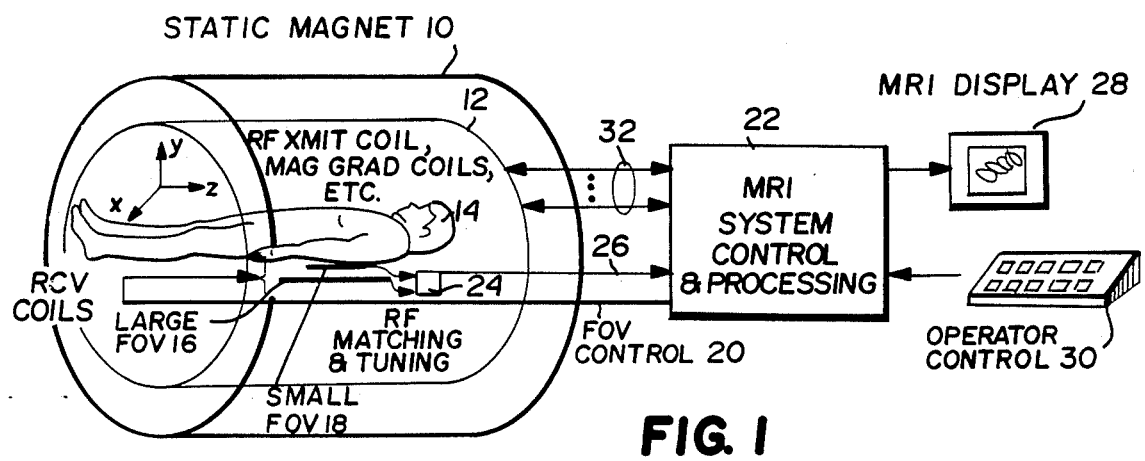
FIG. 1 is a simplified schematic diagram of an MRI system incorporating an RF MRI coil array in accordance with this invention.

The exemplary system shown in FIG. 1 includes the usual elements of a magnetic resonance imaging (MRI) system. For example, there is a static magnet structure 10 (e.g., a cyrogenic solenoidal magnet producing a static field in the Z direction) associated with a collection of RF transmitting coil(s), magnetic gradient coils, shims, etc., 12 which are capable of effecting gradients in the static magnetic field along any desired spatial direction in conjunction with the programmed sequence of RF pulses transmitted into a desired portion of a body 14 to be imaged. MRI responses are, in this exemplary embodiment, selectively coupled either to the large field of view (FOV) RF receiving coil 16 or to a smaller FOV RF receiving coil 18. Selection of the desired active receive coil 16 or 18 may be achieved through manual switch actuation or through electrical control voltages via line 20 from MRI system control and processing circuits 22. Since the necessary electrical control signals simply constitute on/off bias voltages, it is not believed necessary to supply any detailed description as to how such bias voltages may be generated (e.g., by minor modification of conventional control and processing circuits 22) so as to turn "on" a desired coil by forward biasing the proper PIN diode switch).

In the exemplary embodiment, a common RF matching and tuning circuit 24 is used for either of the selected active receive coils 16, 18 so as to match their impedance to a suitable RF transmission line (e.g., a 50 ohm coaxial cable) 26 which feeds the NMR RF responses to the MRI system control and processing circuits 22 for conventional processing into a MRI display 28. As will be appreciated, such systems typically are under operator control via keyboard 30 and the control and processing circuits 22 typically also actively control the magnetic gradient coils and RF transmitting coil, etc., via conventional control/RF transmission lines 32.

Figure 2A:
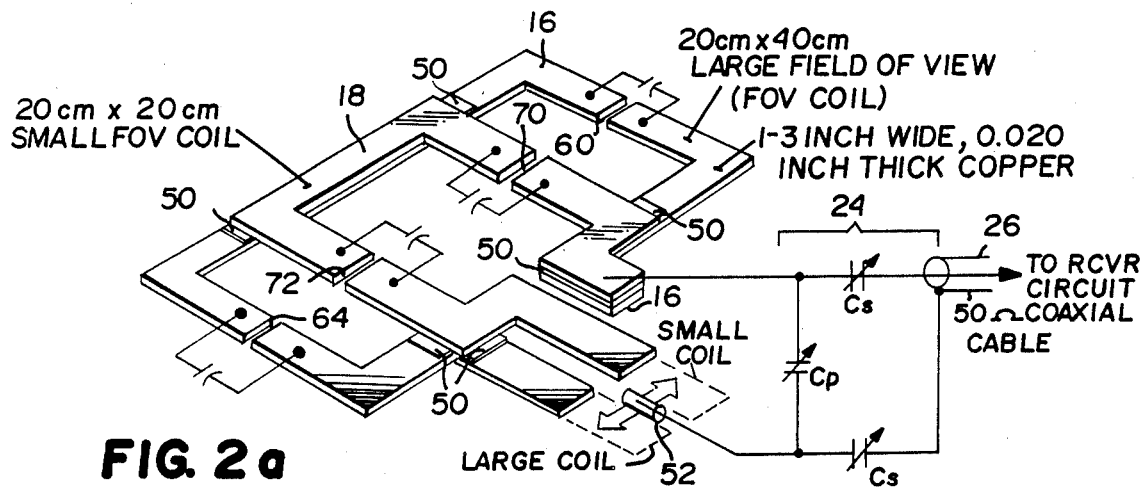
Figure 2B:
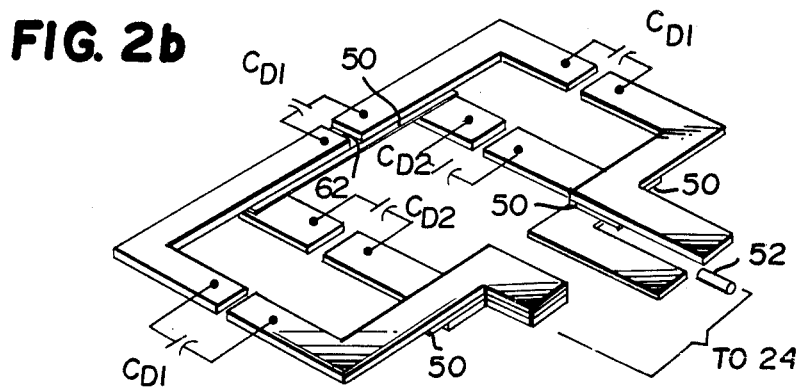

The physical structure of exemplary surface coils 16, 18 is depicted schematically at FIG. 2a (and on the reverse side at FIG. 2b). Each surface coil 16, 18 is formed of a relatively wide strip of relatively thin copper (e.g., 1 to 3 inches wide and 0.020 inch thick). In the exemplary embodiment, each of the surface coils has a width dimension of approximately 20 cm while their length dimensions differ by a factor of 2. In particular, the large FOV coil 16 has a length of about 40 cm while the smaller FOV coil 18 has a length of about 20 cm. As depicted in the FIGS., the center of the field of view of each coil is approximately coincident. A suitable thin layer of insulation 50 (e.g., a layer of insulating tape or the like) electrically insulates coil 16 from coil 18.

As depicted in FIG. 2a, the right-hand terminal leg of each coil 16, 18 is commonly connected to one side of RF tuning/matching circuit 24 (comprising parallel capacitance $C_p$ and balanced series capacitances $C_s$) used to tune the inductive coil reactance to resonance at a desired operating frequency (e.g., 15 MHz) and to match its impedance to that of the transmission line 26 (e.g., 50 ohm coaxial cable). The other input terminal of the RF matching/tuning circuit 24 is connected to an electrical contact 52 located intermediate spaced apart left-hand terminal leg portions of coil 16, 18 and is capable of being selectively connected to either one of the proximate coil legs so as to selectively utilize either the large FOV coil 16 or the small FOV coil 18.

As may be seen in FIGS. 2a and 2b, the continuity of the conductive portion of coil 16 has periodic interruptions 60, 62 and 64 which are bridged by distributed capacitance elements (e.g., fixed capacitances) $C_{D1}$. Similarly, the small FOV coil 18 has its continuity interrupted periodically at 70 and 72 which interruptions are bridged by distributed capacitance elements $C_{D2}$.

Such distributed capacitance elements automatically break the DC continuity of the coil structures thus preventing the flow of currents which might disturb the static/gradient magnetic field while also facilitating use of electrically biased varactor capacitance $C_p$ and/or the series matching/coupling capacitances $C_s$ within the tuning/matching circuit 24.

As will be appreciated by those in the art, a given tuning/matching circuit 24 is only capable of tuning-/matching inductive reactances within some predetermined range extending from some minimum LA to some maximum LB. To accommodate inductive reactances outside this normal matching/tuning range, additional fixed capacitors or the like might have to be connected so as, in effect, to reconfigure or re-dimension the tuning/matching circuit 24. The use of the distributed capacitance elements $C_D$ also provide a convenient way to permit usage of but a single common tuning-/matching circuit 24 for any one of the array coils that may be selected for use. For example, the terminal inductive reactance L1 of coil 16 and L2 of coil 18 presented to the tuning/matching range LA to LB. That is, the terminal inductive reactance of any given coil will represent the sum of the reactive inductances of the various conductive coil sections minus the capacitive reactances of the distributed capacitance elements $C_D$. Accordingly, by properly dimensioning the distributed capacitances, the terminal inductive reactance of even the larger coil 16 may be reduced so as to be approximately similar to that of the smaller coil 18.

In one exemplary embodiment, the conductive strap elements are one inches wide, the gaps in continuity are formed at the mid-points of the respective legs as depicted in FIG. 2a and 2b and capacitances $C_{D1}$ are 230 pf while capacitances $C_{D2}$ are 580 pf thus causing the terminal inductance of coil 16 to be 0.72 microhenries and the terminal inductance L2 of coil 18 to be 0.42 microhenries. Thus, the resulting inductive reactance presented at the terminal of either of the selected coils is within the operating range of the tuning/matching circuit 24 (e.g., having parallel capacitance of 420–470 pf and balanced series capacitance $C_s$ of 25–100 pf (with respect to a 50 ohm coaxial cable 26).

Since a balanced RF feed is used in the embodiment of FIGS. 2a and 2b, the switch element 52 will be at a point which experiences a considerable RF voltage swing. Accordingly, the RF performance of the switch element is important—as is the ability to conveniently and easily actuate the switch element so as to select a desired one of the coils without necessitating movement of the patient and/or major coil structure with respect to the patient. An exemplary embodiment of a mechanically actuated RF electrical switch suitable for such purposes is depicted at FIG. 3. Here, the common RF input/output terminal 52 as well as the terminal leg portions of the coil 16 and 18 are all brought to a common plane within an insulating substrate 80. A relatively wide (e.g., 1.0 inches) spring-loaded conductive finger element 82 (e.g., made of beryllium-copper) is mechanically attached (e.g., by epoxy) to one end of a manual operator actuating rod 84 which is constrained for sliding movement by suitable guides 86a and 86b. These guides also hold the actuator rod 84 and hence conductive switch element 82 so as to exert a downwardly directed contact force on the conductive fingers at contact element 82 thus insuring that it is always in firm slidable contact with the conductive surfaces of the elements 16, 52 and 18 as depicted in FIG. 3. A stop element 88 may be affixed to the actuator rod 84 between guides 86a and 86b so as to limit sliding movement between a first position as shown in FIG. 3 (i.e., selecting the large FOV coil 16 for use) and an opposite second position (i.e., selecting the small FOV coil 18 for use).

The presently preferred exemplary embodiment is schematically depicted at FIG. 4. Here, rather than manually actuated RF switch elements, electrically actuated switch elements (e.g., PIN diodes) are serially interposed within each of the coils 16 and 18. Here, a desirable balanced RF feed circuit is utilized as in FIG. 2a. As depicted in FIG. 4, this implies that there will be substantial voltage swings at the input terminals of the coil structures. However, it also implies that there is a substantial zero RF potential at the approximate midpoint of each of the coils 16, 18. Accordingly, it is possible to locate a PIN diode switch (typically a plurality of parallel connected PIN diodes) while minimizing adverse lowering of the coil Q and also facilitating the connection of the necessary control circuit connections for electrical actuation of such switch elements with minimum adverse RF coupling problems to such control circuits.

As depicted in FIG. 4, a PIN diode switch 90 is located at the approximate zero RF potential point within coil 18 while a similar PIN diode switch 92 is located at a similar point in coil 16. One side of each such switch structure is interconnected by an appropriate parallel resonant RF trap 94, 96 to a common control circuit return path 98 while the other end of these switch structures 90, 92 is individually connected via a further appropriate parallel resonant RF trap 100 and 102 to separate coil select control circuits 104 and 106. As will be appreciated, the parallel resonant RF traps present an approximately maximum impedance at the intended operating frequency of the coil (e.g., 15 MHz) while presenting a very low DC impedance (e.g., the equivalent series resistance of the coil portion of the resonant circuit) to bias control voltages applied so as to switch the PIN diode switches 90, 92 either "on" or "off."

As will be appreciated, it may be necessary to re-dimension the distributed capacitances $C_D$ in the FIG. 4 embodiment so as to provide terminal inductive reactances required so that a common tuning and matching circuit 24 may still be utilized.

As may be seen in FIG. 4, this preferred embodiment utilizes 4 parallel resonant trap circuits. In addition, if the control circuit connections and PIN diodes are to be located at a substantially zero RF potential point, then there are a number of components and connections which must be made in a fairly small physical space.

Accordingly, an alternative exemplary embodiment is depicted at FIG. 5. Here, only two parallel resonant trap circuits (100 and 102) are required since the control circuit return is shared in common with the RF return in an unbalanced tuning/matching circuit 24. Such an unbalanced tuning/matching arrangement is required so as to again place the electrically switchable diode elements 90, 92 at approximately zero RF potential points (thus minimizing adverse Q effects on the coil and/or adverse RF coupling to the switch control circuit).

It will be noted that in these exemplary embodiments, the non-selected coil(s) need not be actively detuned (e.g., so as to avoid adverse coupling to the selected coil and/or transmit RF coil) since it is effectively disconnected (e.g., so as to no longer constitute an RF coil). This may be useful in avoiding image artifact.

As should be appreciated, although surface coils have been depicted in the exemplary embodiments, other types of RF coils (either transmitting and receiving or coils used commonly for both transmitting and receiving) may similarly be utilized. Furthermore, although the exemplary embodiments only depict two coils within the switch selectable coil array, additional individual coils could also be included within such a switch selectable array.

While only a few exemplary embodiments have been disclosed in detail, those skilled in the art will recognize that many variations and modifications may be made in these exemplary embodiments while yet retaining many of the novel features and advantages of this invention. Accordingly, all such variations and modifications are intended to be included within the scope of the appended claims.

What is claimed is:

1. An RF MRI receiving coil array comprising:
   a tuning and matching circuit for connection to an RF transmission line;
   a first MRI RF receive coil adapted for receiving RF signals from a predetermined NMR species;
   a second MRI RF receive coil also adapted for receiving RF signals from the same said predetermined species;
   said first and second MRI RF receive coils having differently dimensioned and overlapping fields of view; and
   controllable switch means connected with said tuning and matching circuit and with said first and second receive coils and capable of selectively conditioning either one of said coil assemblies for use in receiving RF signals and routing them through said tuning and matching circuit during an MRI procedure.

2. An RF MRI receiving coil array as in claim 1 wherein each of said coils includes at least one distributed capacitance element serially disposed therealong and said controllable switch means comprises:
   first electrically operable switch means connected serially with said first coil;
   second electrically operable switch means connected serially with said second coil; and
   first and second control circuits respectively electrically connected to said first and second switch means to permit selective electrical actuation of each said switch means.

3. An RF MRI receiving coil array as in claim 2 wherein:
   said first and second switch means each include a diode switch; and
   said first and second control circuits each include an RF trap circuit exhibiting an approximately parallel resonance maximum RF impedance at the MRI RF operating frequency of said coils.

4. An RF MRI receiving coil array comprising:
   a first MRI RF receive coil;
   a second MRI RF receive coil;
   said first and second MRI RF receive coils having differently dimensioned and overlapping fields of view; and
   controllable switch means connected with said first and second receive coils and capable of selectively conditioning either of said coil assemblies for use in receiving RF signals during an MRI procedure;
   wherein said controllable switch means includes manually movable electrical contacts included as a part of an RF circuit within both of said coils.

5. An RF MRI receiving coil array comprising:
   a first MRI RF receive coil adapted for receiving RF signals from said predetermined species;
   a second MRI RF receive coil also adapted for receiving RF signals from said predetermined species;
   said first and second MRI RF receive coils having differently dimensioned and overlapping fields of view; and
   controllable switch means connected with said first and second receive coils and capable of selectively conditioning either of said coil assemblies for use in receiving RF signals during an MRI procedure;
   wherein each of said coils includes at least one distributed capacitance element serially disposed therealong and said controllable switch means includes
   first electrically operable switch means connected serially with said first coil;
   second electrically operable switch means connected serially with said second coil; and
   first and second control circuits respectively electrically connected to said first and second switch means to permit selective electrical actuation of each said switch means; and
   wherein each of said switch means is located within its respective coil at a point having an approximately zero RF potential.

6. An RF receiving coil array comprising:
   a first MRI RF receive coil;
   a second MRI RF receive coil;
   said first and second MRI RF receive coils having differently dimensioned and overlapping field of view; and
   controllable switch means connected with said first and second receive coils and capable of selectively conditioning either of said coil assemblies for use in receiving RF signals during an MRI procedure;
   wherein each of said coils includes at least one distributed capacitance element serially disposed therealong and said controllable switch means includes
   first electrically operable switch means connected serially with said first coil;

second electrically operable switch means connected serially with said second coil; and first and second control circuits respectively electrically connected to said first and second switch means to permit selective electrical actuation of each said switch means;

wherein said first and second switch means each include a diode switch;

said first and second control circuits each include an RF trap circuit exhibiting an approximately parallel resonance maximum RF impedance at the MRI RF operating frequency of said coils; and each of said switch means is located within its respective coil at a point having an approximately zero RF potential.

7. An RF MRI receiving coil array as in claim 6 wherein said first and second control circuits share a common electrical return circuit connected thereto by respectively associated additional parallel RF trap circuits.

8. An RF MRI receiving coil array comprising:
a first MRI RF receive coil;
a second MRI RF receive coil;
said first and second MRI RF receive coils having differently dimensioned and overlapping fields of view; and
controllable switch means connected with said first and second receive coils and capable of selectively conditioning either of said coil assemblies for use in receiving RF signals during an MRI procedure;
wherein each of said coils includes at least one distributed capacitance element serially disposed therealong and said controllable switch means includes
first electrically operable switch means connected serially with said first coil;
second electrically operable switch means connected serially with said second coil; and
first and second control circuits respectively electrically connected to said first and second switch means to permit selective electrical actuation of each said switch means;
wherein each of said switch means is located within its respective coil at a point of approximately zero RF potential and shares a common dc control current return circuit with an RF circuit.

9. An RF MRI receiver coil array comprising:
a first MRI RF receive coil adapted for receiving RF signals from a predetermined NMR species;
a second MRI receive coil also adapted for receiving RF signals from the same predetermined NMR species;
said first and second MRI RF coils having differently dimensioned and overlapping fields of view;
a common single RF tuning/matching circuit with a common set of adjustable capacitance elements connected to both said RF coils and capable of tuning/matching either coil to a predetermined RF impedance; and
controllable switch means connected with said first and second coils and capable of selectively conditioning either one of said coil assemblies for use in an MRI procedure.

10. An RF MRI coil array comprising:
a first MRI RF coil;
a second MRI RF coil;
said first and second MRI RF coils having differently dimensioned and overlapping fields of view;
a common RF tuning/matching circuit connected to both said RF coils and capable of tuning/matching either coil to a predetermined RF impedance; and
controllable switch means connected with said first and second coils and capable of selectively conditioning either one of said coil assemblies for use in an MRI procedure;
wherein said controllable switch means includes manually movable electrical contacts included as a part of an RF circuit within both of said coils.

11. An RF MRI coil array as in claim 9 wherein said controllable switch means comprises:
first electrically operable switch means connected serially with said first coil;
second electrically operable switch means connected serially with said second coil; and
first and second control circuits respectively electrically connected to said first and second switch means to permit selective electrical actuation of each of said switch means.

12. An RF MRI coil array as in claim 11 wherein at least one of said switch means is located within its respective coil at a point having an approximately zero RF potential.

13. An RF MRI coil array comprising:
a first MRI RF coil;
a second MRI RF coil;
said first and second MRI RF coils having differently dimensioned and overlapping fields of view;
a common RF tuning/matching circuit connected to both said RF coils and capable of tuning/matching either coil to a predetermined RF impedance; and
controllable switch means connected with said first and second coils and capable of selectively conditioning either one of said coil assemblies for use in an MRI procedure;
wherein said controllable switch means includes
first electrically operable switch means connected serially with said first coil;
second electrically operable switch means connected serially with said second coil; and
first and second control circuits respectively electrically connected to said first and second switch means to permit selective electrical actuation of each said switch means;
said first and second switch means each include a diode switch; and
said first and second control circuits each include an RF trap circuit exhibiting an approximately parallel resonance maximum RF impedance at the MRI REF operating frequency of said coils.

14. An RF MRI coil array as in claim 13 wherein at least one of said switch means is located within its respective coil at a point having an approximately zero RF potential.

15. An RF MRI coil array as in claim 14 wherein said first and second control circuits share a common electrical return circuit connected thereto by respectively associated additional parallel-resonant RF trap circuits.

16. An RF MRI coil array comprising:
a first MRI RF coil;
a second MRI RF coil;
said first and second MRI RF coils having differently dimensioned and overlapping fields of view;

a common RF tuning/matching circuit connected to both said RF coils and capable of tuning/matching either coil to a predetermined RF impedance; and controllable switch means connected with said first and second coils and capable of selectively conditioning either one of said coil assemblies for use in an MRI procedure;

first electrically operable switch means connected serially with said first coil;

second electrically operable switch means connected serially with said second coil; and first and second control circuits respectively electrically connected to said first and second switch means to permit selective electrical actuation of each of said switch means;

wherein at least one of said switch means is located within its respective coil at a point of approximately zero RF potential and shares a common de control current return circuit with the RF tuning/matching circuit.

17. An RF MRI receive coil array comprising:

a first MRI RF receive coil assembly having first distributed capacitance serially connected therealong and presenting a terminal inductance L1;

a second MRI RF receive coil assembly having a second distributed capacitance serially distributed therealong and presenting a terminal inductance L2;

said first and second coil assemblies having differently sized but overlapping respective fields of view;

a common single RF tuning and matching circuit having a common set of adjustable capacitance elements connected to both said first and second coil assemblies and capable of tuning and matching inductive reactances between a minimum LA and a maximum LB value;

said first and second coil assemblies and associated distributed capacitances being dimensioned so as to cause both L1 and L2 to fall within the range LA to LB; and controllable switch means connected with said first and second coil assemblies and capable of selectively conditioning either one of said coil assemblies for use in an MRI procedure.

18. An RF MRI coil array as in claim 17 wherein said controllable switch means comprises:

first electrically operable switch means connected serially with said first coil assembly;

second electrically operable switch means connected serially with said second coil assembly; and first and second control circuits respectively electrically connected to said first and second switch means to permit selective electrical actuation of each of said switch means.

19. An RF MRI coil array as in claim 18 wherein at least one of said switch means is located within its respective coil assembly at a point having an approximately zero RF potential.

20. An RF MRI coil array comprising:

a first MRI RF coil assembly having first distributed capacitance therealong and presenting a terminal inductance L1;

a second MRI RF coil assembly having a second distributed capacitance therealong and presenting a terminal inductance L2;

said first and second coil assemblies having differently sized but overlapping respective fields of view;

a common RF tuning and matching circuit connected to both said first and second coil assemblies and capable of tuning and matching inductive reactances between a minimum LA and a maximum LB value;

said first and second coil assemblies and associated distributed capacitances being dimensioned so as to cause both L1 and L2 to fall within the range KLA to LB; and controllable switch means connected with said first and second coil assemblies and capable of selectively conditioning either one of said coil assemblies for use in an MRI procedure;

wherein each of said coil assemblies includes a surface coil of conductive strip having interruptions in its continuity bridged by capacitance elements.

21. An RF MRI coil array as in claim 20, wherein said first coil assembly includes a surface coil having an enclosed area approximately twice the area enclosed by the surface coil of the second coil assembly.

22. An RF MRI coil array as in claim 21 wherein said first coil assembly encloses an area of approximate dimensions $2L \times W$ while said second coil assembly encloses an area of approximate dimensions $L \times W$ approximately centered within said first coil assembly.

23. An RF MRI coil array comprising:

a first MRI RF coil assembly having first distributed capacitance therealong and presenting a terminal inductance L1;

a second MRI RF coil assembly having a second distributed capacitance therealong and presenting a terminal inductance L2;

said first and second coil assemblies having differently sized but overlapping respective fields of view;

a common RF tuning and matching circuit connected to both said first and second coil assemblies and capable of tuning and matching inductive reactances between a minimum LA and a maximum LB value;

said first and second coil assemblies and associated distributed capacitances being dimensioned so as to cause both L1 and L2 to fall within the range KLA to LB; and controllable switch means connected with said first and second coil assemblies and capable of selectively conditioning either one of said coil assemblies for use in an MRI procedure;

wherein said controllable switch means includes manually movable electrical contacts included as a part of an RF circuit within both of said coil assemblies.

24. An RF MRI coil array as in claim 23 wherein said controllable switch means comprises:

a first fixed contact area connected to said first coil assembly;

a second fixed contact area connected to said RF tuning and matching circuit;

a third fixed contact area connected to said second coil assembly; and a movable bridge contact area having spring-loaded contact fingers slidable into and out of a bridging RF circuit of contact between said second contact area and either one of said first and third contact areas.

25. An RF MRI coil array as in claim 24 wherein said controllable switch means comprises:
an elongated operating arm mechanically coupled to said movable bridge contact and slidably mounted for movement of same in response to operator movement of the operating arm.

26. An RF MRI coil array comprising:
a first MRI RF coil assembly having first distributed capacitance therealong and presenting a terminal inductance L1;
a second MRI RF coil assembly having a second distributed capacitance therealong and presenting a terminal inductance L2;
said first and second coil assemblies having differently sized but overlapping respective fields of view;
a common RF tuning and matching circuit connected to both said first and second coil assemblies and capable of tuning and matching inductive reactances between a minimum LA and a maximum LB value;
said first and second coil assemblies and associated distributed capacitances being dimensioned so as to cause both L1 and L2 to fall within the range KLA to LB; and
controllable switch means connected with said first and second coil assemblies and capable of selectively conditioning either one of said coil assemblies for use in an MRI procedure;
wherein said controllable switch means includes
first electrically operable switch means connected serially with said first coil assembly;
second electrically operable switch means connected serially with said second coil assembly; and
first and second control circuits respectively electrically connected to said first and second switch means to permit selective electrical actuation of each of said switch means;
said first and second switch means each include a diode switch; and
said first and second control circuits each include an RF trap circuit exhibiting an approximately parallel resonance maximum RF impedance at the MRI RF operating frequency of said coil assemblies. coil assembly at a point having an approximately zero RF potential.

27. An RF MRI coil array as in claim 26 wherein each said switch means is located within its respective coil assembly at a point having an approximately zero RF potential.

28. An RF MRI coil array as in claim 27 wherein said first and second control circuits share a common electrical return circuit connected thereto by respectively associated additional RF trap circuits.

29. An RF MRI coil array as in claim 26 wherein at least one of said switch means is located within its respective coil assembly at a point having an approximately zero RF potential.

30. An RF MRI coil array as in claim 29 wherein said first and second control circuits share a common electrical return circuit connected thereto by respectively associated additional RF trap circuits.

31. An RF MRI coil array comprising:
a first MRI RF coil assembly having first distributed capacitance therealong and presenting a terminal inductance L1;
a second MRI RF coil assembly having a second distributed capacitance therealong and presenting a terminal inductance L2;
said first and second coil assemblies having differently sized but overlapping respective fields of view;
a common RF tuning and matching circuit connected to both said first and second coil assemblies and capable of tuning and matching inductive reactances between a minimum LA and a maximum LB value;
said first and second coil assemblies and associated distributed capacitances being dimensioned so as to cause both L1 and L2 to fall within the range KLA to LB; and
controllable switch means connected with said first and second coil assemblies and capable of selectively conditioning either one of said coil assemblies for use in an MRI procedure;
wherein said controllable switch means includes
first electrically operable switch means connected serially with said first coil assembly;
second electrically operable switch means connected serially with said second coil assembly; and
first and second control circuits respectively electrically connected to said first and second switch means to permit selective electrical actuation of each of said switch means;
each said switch means is located within its respective coil assembly at a point having an approximately zero RF potential.

32. An RF MRI coil array comprising:
a first MRI RF coil assembly having first distributed capacitance therealong and presenting a terminal inductance L1;
a second MRI RF coil assembly having a second distributed capacitance therealong and presenting a terminal inductance L2;
said first and second coil assemblies having differently sized but overlapping respective fields of view;
a common RF tuning and matching circuit connected to both said first and second coil assemblies and capable of tuning and matching inductive reactances between a minimum LA and a maximum LB value;
said first and second coil assemblies and associated distributed capacitances being dimensioned so as to cause both L1 ad L2 to fall within the range KLA to LB; and
controllable switch means connected with said first and second coil assemblies and capable of selectively conditioning either one of said coil assemblies for use in an MRI procedure;
wherein said controllable switch means includes
first electrically operable switch means connected serially with said first coil assembly;
second electrically operable switch means connected serially with said second coil assembly; and
first and second control circuits respectively electrically connected to said first and second switch means to permit selective electrical actuation of each of said switch means;
each said switch means is located within its respective coil assembly at a point of approximately zero RF potential and shares a common dc control current return circuit with the RF tuning and matching circuit.

33. An RF MRI coil array comprising:

a first MRI RF coil assembly having first distributed capacitance therealong and presenting a terminal inductance L1;

a second MRI RF coil assembly having a second distributed capacitance therealong and presenting a terminal inductance L2;

said first and second coil assemblies having differently sized but overlapping respective fields of view;

a common RF tuning and matching circuit connected to both said first and second coil assemblies and capable of tuning ad matching inductive reactances between a minimum LA and a maximum LB value;

said first and second coil assemblies and associated distributed capacitances being dimensioned so as to cause both L1 and L2 to fall within the range KLA to LB; and controllable switch means connected with said first and second coil assemblies and capable of selectively conditioning either one of said coil assemblies for use in an MRI procedure;

wherein said controllable switch means includes first electrically operable switch means connected serially with said first coil assembly;

second electrically operable switch means connected serially with second coil assembly; and first and second control circuits respectively electrically connected to said first and second switch means to permit selective electrical actuation of each of said switch means;

at least one of said switch means is located within its respective coil assembly at a point of approximately zero RF potential and shares a common dc control current return circuit with the RF tuning and matching circuit.

34. An MRI method comprising the steps of:

deriving a first low resolution MRI image of a patient using a first RF receiving coil having a first field of view;

switch selecting a second RF receiving coil having a second field of view, which is smaller and overlapping said first field of view, without physically moving said patent; and deriving a second, higher resolution MRI image of said smaller second field of view within said patient without physically moving said patient.

* * * * *